United States Patent [19]

Ito

[11] Patent Number: 4,491,975

[45] Date of Patent: Jan. 1, 1985

[54] RADIO RECEIVER OF ELECTRONIC TUNING SYSTEM HAVING AUTOMATIC PRESETTING CIRCUIT

[75] Inventor: Tatsuo Ito, Kobe, Japan

[73] Assignee: Fujitsu Ten Limited, Kobe, Japan

[21] Appl. No.: 434,325

[22] Filed: Oct. 14, 1982

[30] Foreign Application Priority Data

Oct. 16, 1981 [JP] Japan ............................. 56-165367

[51] Int. Cl.³ .............................................. H03J 7/18
[52] U.S. Cl. .................................... 455/166; 455/168; 455/186
[58] Field of Search ............... 455/161, 165, 166, 168, 455/185, 186

[56] References Cited

U.S. PATENT DOCUMENTS 4,222,121 9/1980 Matsumoto et al. ................ 455/168
4,236,251 11/1980 Ohgishi et al. ...................... 455/165
4,298,989 11/1981 Someno et al. ..................... 455/161

OTHER PUBLICATIONS

"Low Cost Digital Tuning System with Full-Function Automatic Search Preset", by Matsu-Ura et al., 8/78.

*Primary Examiner*—Jin F. Ng
*Attorney, Agent, or Firm*—Staas & Halsey

[57] ABSTRACT

A radio receiver electronic tuning system includes a frequency sweep circuit for changing received frequencies by sequentially changing received frequency designating information, and a broadcasting wave search circuit for generating a search stop signal when receiving a broadcasting wave having a received electric field intensity higher than a certain level during the frequency sweep. The receiver further includes a preset channel selecting circuit for reading out the received frequency designating information prestored in a preset memory in an area corresponding to a channel selection key at the time of the operation thereof, thereby permitting direct channel selection. When an auto-preset key is actuated, the frequency sweep circuit is activated to sequentially change the received frequencies. When the search stop signal is generated during the sequential changing of the received frequencies, the received frequency designating information is stored in the preset memory.

8 Claims, 4 Drawing Figures

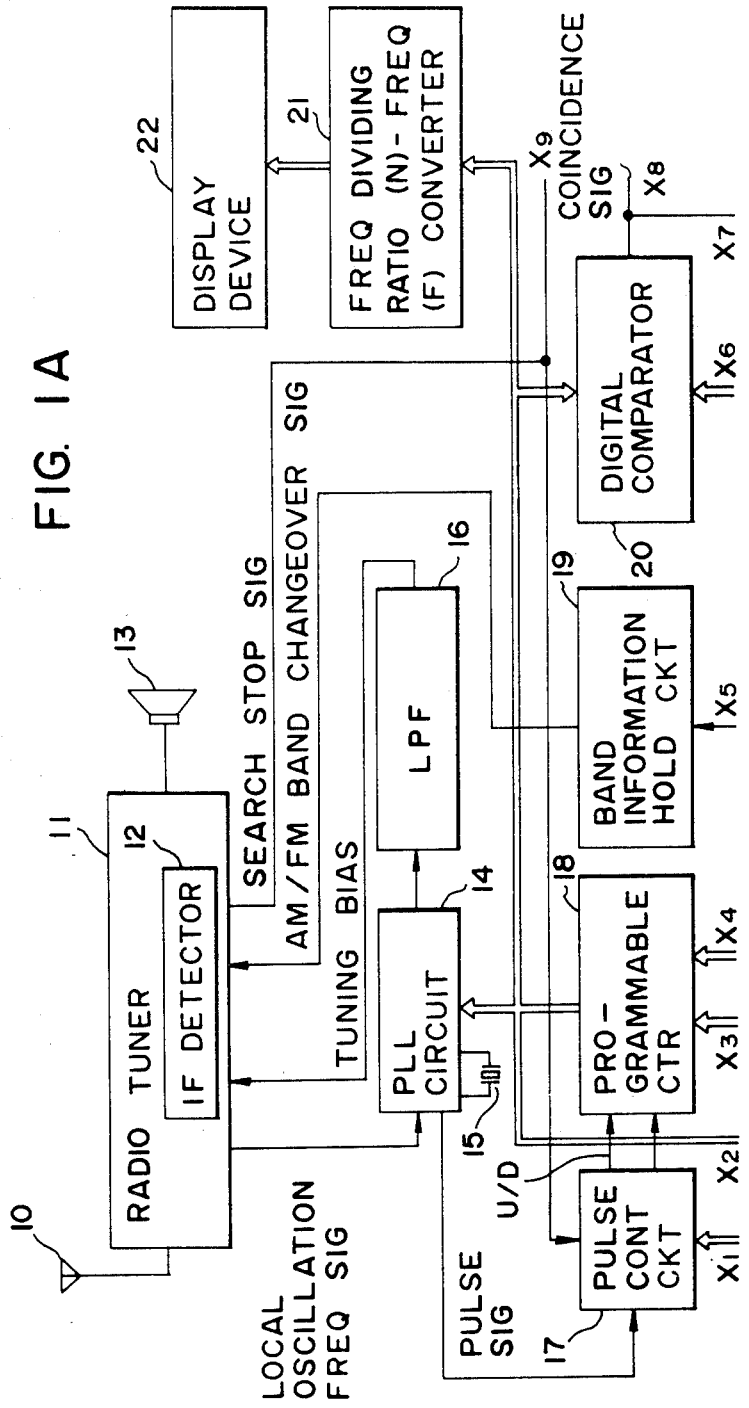

RADIO RECEIVER OF ELECTRONIC TUNING SYSTEM HAVING AUTOMATIC PRESETTING CIRCUIT

BACKGROUND OF THE INVENTION

1. Field of the Invention

The present invention relates to a radio receiver which employs an electronic tuning system and, more particularly, to an improvement of its preset means.

2. Description of the Prior Art

A presettable radio receiver of the type adopting an electronic tuning system permits the direct reception of a desired broadcasting station only by depressing a channel selection button preset to the frequency thereof and, in addition, it is almost free from the influence of mechanical vibrations and excellent in durability, unlike a mechanical preset mechanism; hence it is extensively used as a car radio or the like. With the conventional radio receiver of this kind, however, when presetting each channel selection button to a particular broadcasting station, operations such as depression of a memory key and the channel selection button are required for the reception of each broadcasting station. Accordingly, when the number of broadcasting stations to be preset is large, the preset operation is very troublesome. In the case of the car radio and the like, it often happens that the preset contents cannot be used, for the most part, when the car leaves the place where the preset operation was carried out; accordingly, the troublesome preset operation has to be performed frequently.

SUMMARY OF THE INVENTION

It is therefore an object of the present invention to provide a radio receiver which readily allows the operation of presetting each channel selection button to the frequency of a particular broadcasting station.

Another object of the present invention is to provide a radio receiver which permits automatic presetting, by one operation, of a broadcasting station transmitting a broadcasting wave having an electric field intensity higher than a certain level.

Yet another object of the present invention is to provide a radio receiver which permits automatic presetting, by one operation, of broadcasting stations of frequencies in a plurality of bands, such as AM and FM bands.

According to the present invention, in a radio receiver electronic tuning system which is provided with frequency sweep means for sequentially changing frequency designating information, such as frequency dividing ratios, to change frequencies to be received, broadcasting wave search means for generating a search stop signal upon reception of a broadcasting wave of a received electric field higher than a certain level during the frequency sweep, and preset channel selecting means for reading out the frequency designating information prestored in a preset memory in an area corresponding to a channel selection key at the time of the operation thereof to thereby permit a direct channel selection. Means is provided for operating the frequency sweep means at the time of operation of an auto-preset key to sequentially change the frequencies to be received and for storing designating information of the received frequency in the preset memory at the time of receiving the search stop signal during the sequential change of the received frequencies.

DESCRIPTION OF THE PREFERRED EMBODIMENTS

Figure 1B:
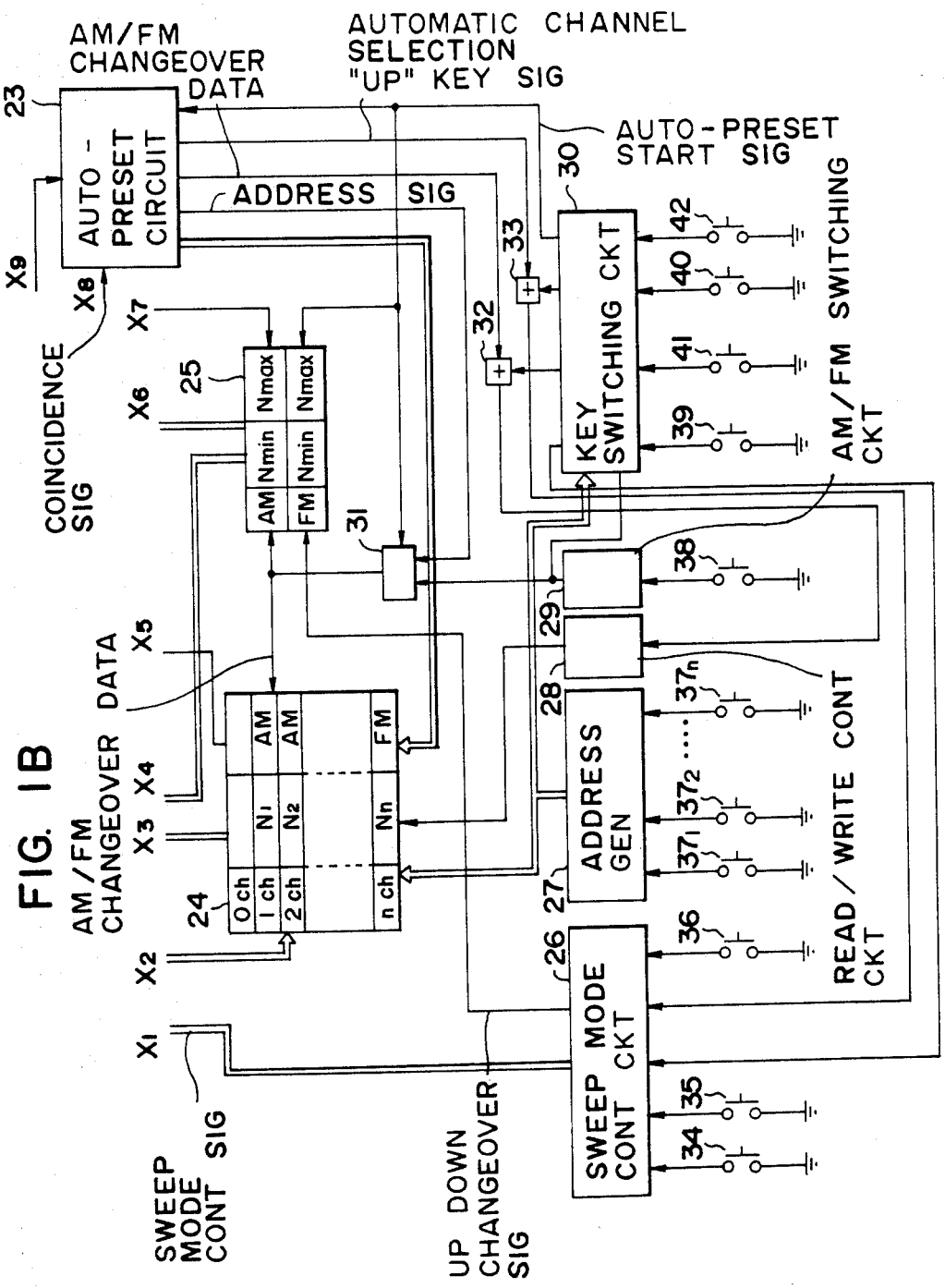
FIGS. 1(A) and (B) are block diagrams of the principal part of an embodiment of the present invention.

FIGS. 1(A) and (B) illustrate in block form the principal part of an embodiment of a radio receiver equipped with the auto-preset function of the present invention. Reference numeral 10 indicates an antenna; 11 designates a radio tuner; 12 identifies an IF detector; 13 denotes a speaker; 14 represents a PLL circuit; 15 shows a crystal oscillator; 16 refers to a low-pass filter; 17 signifies a pulse control circuit; 18 indicates a programmable counter; 19 designates a band information hold circuit; 20 denotes a digital comparator; 21 represents a frequency dividing ratio-frequency converter; 22 shows a display device; 23 refers to an auto-preset circit; 24 signifies a preset memory; 25 indicates an upper and lower limit values setting memory; 26 designates a sweep mode control circuit; 27 indentifies an address generator; 28 denotes a read/write control circuit; 29 represents an AM/FM switching circuit; 30 shows a key switching circuit; 31 refers to a changeover switch; 32 and 33 signify OR circuits; 34 indicates a manual channel selection down key (MSD); 35 designates a manual channel selection up key (MSU); 36 identifies a scanner; $37_1$ to $37_n$ denote first to nth channel selection keys; 38 denotes an AM/FM key; 39 represents an automatic channel selection "down" key (ASD); 40 shows an automatic channel selection "up" key (ASU); 41 refers to a memory key; and 42 signifies an auto-preset key.

The radio tuner 11 adopts what is called an electronic tuning method and employs varicap diodes as a capacitor of a tuning circuit which is used for the selection of radio waves received from the antenna 10 and a capacitor of a local oscillator which generates a local oscillation frequency signal which is mixed with the received radio waves to obtain an intermediate-frequency signal. The radio tuner 11 is so arranged as to be able to electronically select radio waves of a desired broadcasting station for reception and reproduction by changing bias voltages to the varicap diodes in accordance with the frequency desired to be received. In the IF detector 12, there is taken out, as a search stop signal, a signal which goes, for example, to "1" when an intermediate-frequency amplifier output exceeds a certain level. In this embodiment, the radio tuner 11 is provided with both AM and FM bands and it is switched therebetween by an AM/FM band switching signal. The search stop signal may also be taken out from other portions of the radio tuner 11, for instance, an RF stage. This type of arrangement for radio tuner the is well-known in the art.

The PLL circuit 14 is equipped with a programmable frequency divider, a phase comparator for phase comparison between a reference signal $f_r$ from the crystal oscillator 15 and a local oscillation frequency signal $f_L$ and so forth, and it provides the detected phase difference to the low-pass filter 16. The PLL circuit 14 operates so that the phase difference signal may assume a reference value when the following relationship is established between the frequency dividing ratio N of the programmable frequency divider, the reference signal $f_r$, and the local oscillation frequency signal $f_L$:

$$f_L = N \cdot f_r \quad (1)$$

The low-pass filter 16 converts the phase difference from the PLL circuit 14 into a difference voltage, which is applied as the bias voltage to the varicap diode of each of the tuning circuit and the local oscillator in the radio tuner 11.

The programmable counter 18 is an up-down counter which provides the frequency dividing ratio N (receiving frequency designating information) to the programmable frequency divider in the PLL circuit 14. The programmable counter 18 is capable of setting therein frequency dividing ratio data from the preset memory 24 the upper and lower limit values setting memory 25, and it is counted up or down by pulses from the pulse control circuit 17. The count output of the programmable counter 18 is applied to the preset memory 24, the digital comparator 20 and the frequency dividing ratio-frequency converter 21, as well as to the PLL circuit 14. The converter 21 calculates the received frequency from the frequency dividing ratio and provides it to the display device 22 for display thereon. The calculation of the received frequency is carried out, for instance, in the following manner:

In the case of the AM broadcasting frequency:

$$f = f_0 - f_i \quad (2)$$
$$f_0 = N \cdot f_r$$

In the case of the FM broadcasting frequency:

$$f = f_0 + f_i \quad (3)$$
$$f_0 = N \cdot f_r$$

Where f is a received frequency, $f_0$ is a local oscillation frequency, $f_i$ is an intermediate frequency and $f_r$ is a reference frequency.

The pulse control circuit 17 supplies the programmable counter 18 with an up/down command U/D and a pulse signal applied from the PLL circuit 14, thereby to selectively change the frequency dividing ratio which is provided to the PLL circuit 14. The pulse control circuit 17 is controlled by the sweep mode control circuit 26 to perform such operations as follows:

Manual channel selection mode

While the manual change selection "up" key 35 or the manual channel selection "down" key 34 is in the ON state, the pulse control circuit 17 continues to generate pulses, thereby changing the value of the frequency dividing ratio N so that the frequency to be received may be raised or lowered in steps of 9 or 10 KHz in the case of the AM broadcasting frequency and 100 or 200 KHz in the case of the FM broadcasting frequency.

Automatic channel selection mode

Once the automatic channel selection "up" key 40 or the automatic channel selection "down" key 39 is turned ON, the pulse control circuit 17 continues to yield pulses to raise or lower the value of the frequency dividing ratio N until it receives the search stop signal from the radio tuner 11. This mode of operation is used when it is desired to receive adjoining frequencies.

Temporary hold automatic channel selection mode (scan mode)

Once the scan key 36 is turned ON, the pulse control circuit 17 continues to generate pulses until it receives the search stop signal as in the case of the automatic channel selection "up" key being turned ON. In this mode, however, the pulse control circuit 17 starts the sweep operation again after stopping the operation for a certain period of time upon reception of the search stop signal; namely, the pulse control circuit 17 repeatedly performs such an intermittent sweep operation until the scan key 36 is turned ON again. Consequently, broadcasting frequencies are received in a repeating cyclic order, each for a fixed period of time.

The preset memory 24 is an RAM for storing frequency dividing ratios $N_1$ to $N_n$ corresponding to the frequencies of broadcasting stations desired to be received and band information (AM/FM). The preset memory 24 has addresses corresponding to the channel selection buttons $37_1$ to $37_n$ and, in this memory, the frequency dividing ratio and the band information corresponding to each address, are written. The addressing of the preset memory 24 is effected by the address generator connected to the channel selection keys $37_1$ to $37_n$ and the addressing can be accomplished by the auto-preset circuit 23, too. The read and write operations of the preset memory 24 are changed over by the read/write control circuit 28. The frequency dividing ratio data is input from the programmable counter 18 and output thereto. The band information is input from the AM/FM switching circuit 29 or the auto-preset circuit 23 and output to the band information hold circuit 19. The band information hold circuit 19 is a latch circuit for holding AM/FM information, and its output is used as a band changeover signal of the radio tuner. Incidentally, when the band being received is changed over between the AM and FM bands, the value N of a last channel (a broadcasting station received last in the band changed over) is stored in a "0" channel 0 ch of the preset memory 24.

The upper and lower limit value setting memory 25 is an ROM which has stored therein the upper limit value Nmax and the lower limit value Nmin of the frequency dividing ratio in each band, and selects information to be output in accordance with the band information (AM/FM switching data) and an up/down changeover signal and operates as follows:

During up mode:

The upper limit value Nmax of the frequency dividing ratio N of the AM or FM band is provided to the digital comparator 20. When supplied with the output from the digital comparator 20 and an auto-preset start signal, the upper and lower limit values setting memory 25 sets the lower limit value Nmin of the frequency dividing ratio N of the AM or FM band in the programmable counter 18.

During down mode:

The lower limit value Nmin of the frequency dividing ratio N of the AM or FM band is provided to the digital comparator 20. When supplied with the output from the digital comparator 20, the upper and lower limit values setting memory 25 sets the lower limit value Nmin of the frequency dividing ratio N of the AM or FM band in the programmable counter 18.

The digital comparator 20 compares the value N of the programmable counter 18 and the value N (Nmin or Nmax) of the upper and lower limit values setting memory 25 and, in the case of coincidence, applies a coincidence signal to the auto-preset circuit 23 and the upper and lower limit values setting memory 25. The digital comparator 20 prevents the value N in the programmable counter from being counted up or down in excess of the upper or lower limit value of each band in the sweep mode.

Figure 2:
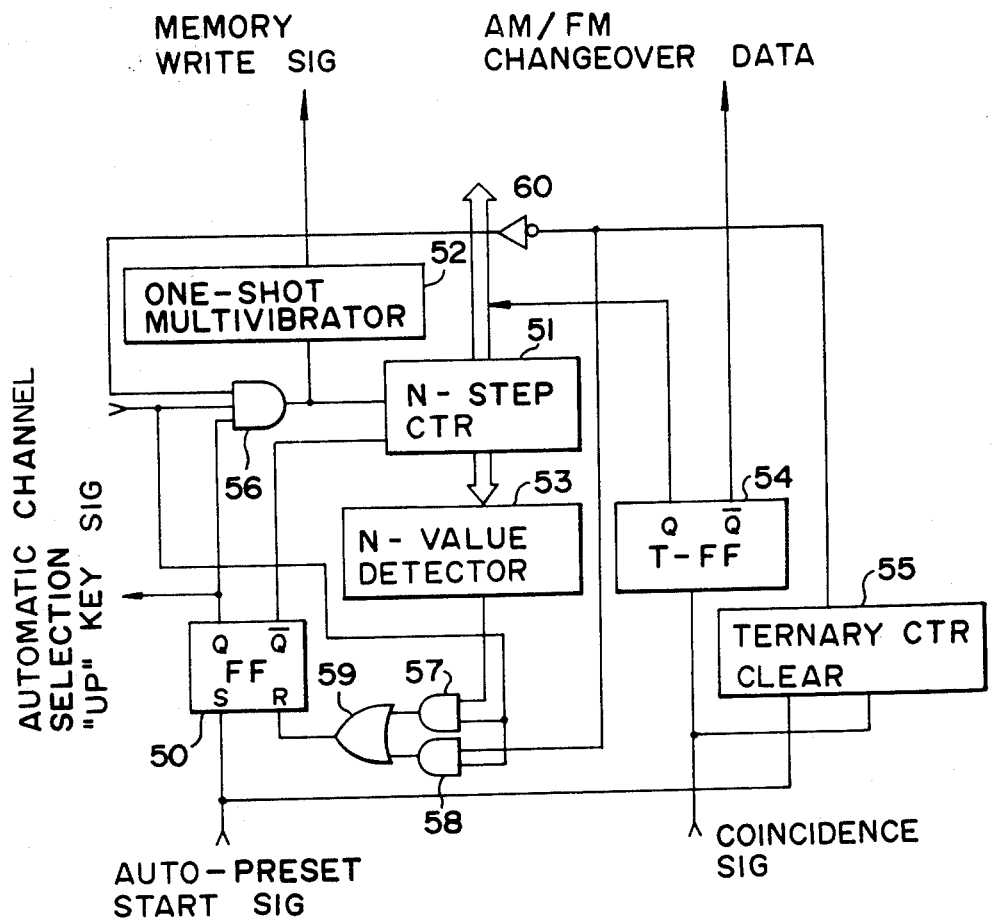
FIG. 2 is a block diagram of the principal part of an example of an auto-preset circuit.

The auto-preset circuit 23 is to control the auto-preset operation which is characteristic of the present invention. FIG. 2 is a block diagram of the principal part of an example of the auto-preset circuit 23. Reference numeral 50 indicates a flip-flop for holding the auto-preset start signal; 51 designates an n-step counter; 52 identifies a one-shot multivibrator; 53 denotes an n-value detector; 54 represents a T flip-flop; 55 shows a ternary counter; 56 to 58 refer to AND circuits; 59 signifies an OR circuit; and 60 indicates an inverter. A description will be given, with reference to FIGS. 1 and 2, of the operation of this example.

(1) Manual channel selecting operation

Upon turning ON of the manual channel selection "up" key 35, the up/down changeover signal from the sweep mode control circuit 26 instructs an upward sweep operation and, in this case, if the AM/FM switching circuit 29 is held on the side of the AM band, the upper limit value Nmax of the AM band is applied from the upper and lower limit values setting memory 25 to the digital comparator 20. Further, the sweep mode control circuit 26 delivers out a control signal of a manual channel selection "up" mode to the pulse control circuit 17, causing it to continue counting up of the programmable counter 18 while the "up" key 35 is in the ON state. Since the count content of the programmable counter 18 is provided as the frequency dividing ratio N of the PLL circuit 14, the frequency being received gradually rises. When the frequency being received reaches the upper value in the AM band, it is detected by the digital comparator 20 which compares the upper limit value Nmax in the AM band and the value N of the programmable counter 18. The lower limit value Nmin in the AM band is set in the programmable counter 18, so that the frequency being received rises from the minimum value. When the manual channel selection "up" key 35 is turned OFF, the pulse control circuit 17 closes its gate to stop the pulse generation and, consequently, the programmable counter 18 holds the value N when the "up" key 35 is turned OFF.

When the manual channel selection "down" key 34 is turned ON, the direction of sweep is the reverse on the abovementioned direction, and when the manual keys 34 and 35 are turned ON during the FM reception, the sweep operation is carried out in the FM band.

(2) Automatic channel selecting operation

Upon turning ON the automatic channel selection "up" key 40, the up/down changeover signal from the sweep mode control circuit 26 instructs the upward sweep operation and, in this case, if the AM band is being received, the upper and lower limit values setting memory 25 provides the upper limit values Nmax in the AM band to the digital comparator 20. Further, the sweep mode control circuit 26 applies a control signal of an automatic channel selection "up" mode to the pulse control circuit 17, causing it to count up the programmable counter 18. When the frequency being received rises and a search stop signal is applied to the pulse control circuit 17 from the IF detector 12 of the radio tuner 11 as a result of the reception of broadcasting waves, the pulse control circuit 17 stops its pulse generating operation if the "up" key 41 is already in the OFF state. Accordingly, the programmable counter 18 holds the value N at the time of the application of the search stop signal. In the case where the "up" key 40 is not yet turned OFF when the search stop signal is applied, the pulse control circuit 17 carries out the count-up operation of the programmable counter 18 to further continue the sweep operation in defiance of the search stop signal.

The operation in the case of the received frequency reaching the upper limit is the same as in the case of the manual channel selection. When the automatic channel selection "down" key 39 is turned ON, the direction of sweep is reversed and when the manual key is turned ON during the FM reception, the sweep takes place in the FM band.

(3) Temporary hold automatic channel selecting operation

When the temporary hold automatic channel selecting key 36 is turned ON, the upper limit value Nmax in the AM or FM band is provided from the upper and lower limit values setting memory 25 to the digital comparator 20 as in the case of the automatic channel selection "up" key 41 being turned ON, and the pulse control circuit 17 receives a control signal of a temporary hold automatic channel selection mode from the sweep mode control circuit 26 and counts up the programmable counter 18. In this mode, an operation of stopping the sweep for a fixed period of time upon the application of the search stop signal and then restarting the sweep is repeatedly carried out until the temporary hold automatic channel selection key 36 is turned ON again.

(4) Manual preset operation

In the case where the broadcasting station being currently received is preset to any one of the channel selection keys $37_1$ to $37_n$, the memory key 40 is pushed first and then the channel selection key to be assigned to the broadcasting station is selected. An address in the preset memory 24 corresponding to the selected channel selection key is designated by the address generator 27 and the value N from the programmable counter 18 and the band information from the AM/FM switching circuit 29 are written in the designated address. For presetting n broadcasting station, the abovementioned operation must be performed for each station.

(5) Preset channel selecting operation

When turning ON a desired one of the channel selection keys $37_1$ to $37_n$, the frequency dividing ratio and the band information written in the corresponding address of the preset memory 24 are read out into the programmable counter 18 and the band information hold circuit 19, permitting a direct selection of the desired broadcasting station for reproducing its broadcasting waves.

(6) Auto-preset operation

When the auto-preset key 42 is turned ON, this information is applied to the upper and lower limit values setting memory 25 and, at the same time, the changeover switch 31 is connected to the side of the auto-preset circuit 23. Furthermore, the flip-flop 50 in the auto-preset circuit 23 is set and the ternary counter 58 is cleared. A set output Q of the flip-flop 50 is applied to the AND circuit 56 to open it and, at the same time, it is used as an automatic channel selection "up" key signal. Consequently, the up/down changeover signal from the sweep mode control circuit 26 instructs the upward sweep operation and the pulse control circuit 17 operates in the automatic channel selection "up" mode to provide additive pulses to the programmable counter 18. In the case of starting the auto-preset operation with the AM band, an output $\bar{Q}$ of the T flip-flop 54 in the auto-preset circuit 23 is preset to, for instance, "0" indicating the AM band. The upper and lower limit values setting memory 25 responds to this information and the instruction of the up/down changeover signal to set the upper limit value Nmax of the AM band in the digital comparator 20 and the lower limit value Nmin of the AM band in the programmable counter 18. As a result of this, the programmable counter 18 is counted up starting with the minimum value Nmin.

Figure 3:
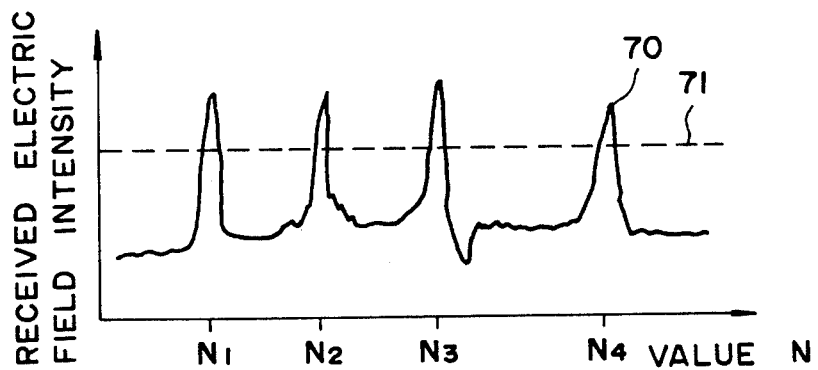
FIG. 3 is a graph showing an example of the distribution of received electric field intensity.

Let it be assumed that the received electric field intensity distribution in the AM band is as indicated by the curve 70 in FIG. 3, and that the detected threshold level of the search stop signal is as indicated by the broken line 71 in FIG. 3. In this case, when gradually increasing the value N of the programmable counter 18 from the minimum lower limit value Nmin, the search stop signal is yielded at each of the frequency dividing ratios $N_1$, $N_2$, $N_3$ and $N_4$ and it is applied to the AND circuit 56 in the auto-preset circuit 23. Since the AND circuit 56 is initially opened, the one-shot multivibrator 52 is triggered by the search stop signal and the n-step counter 51 is counted up by one. The output of the n-step counter 51 is applied as an address signal to the preset memory 24 and the output of the one-shot multivibrator 52 is provided as a memory write signal to the preset memory 24. Consequently, upon each application of the search stop signal to the auto-preset circuit 23, the value N of the programmable counter 18 at that moment is written in the preset memory 24 at the address designated by the n-step counter 51. At the same time, the band information of the AM/FM changeover data is written in the preset memory 24. In other words, the frequency dividing ratios $N_1$ to $N_4$ and the information that the frequency being received is of the AM band, are written in the preset memory 24 at addresses for first to fourth channels.

When the programmable counter 18 is counted up to reach the upper limit value Nmax of the AM band, it is detected by the digital comparator 20 and a coincidence signal is provided to the T flip-flop 54 of the auto-preset circuit 23 to invert the flip-flop 54. At the same time, the ternary counter 55 is counted up by one. Upon the inversion of the T flip-flop 54, the AM/FM changeover data applied to the upper and lower limit values setting memory 25 instructs the FM reception, in consequence of which the memory 25 having received the coincidence signal sets the lower limit value Nmin of the FM band in the programmable counter 18 and the upper limit value Nmax in the digital comparator 20. As a result of this, the FM band is gradually swept starting with the frequency dividing ratio Nmin and, as in the case of the AM band reception, the value N at the time of generation of the search stop signal accompanying the detection of broadcasting waves, is loaded in the preset memory 24 at an address designated by the n-step counter 51.

When the count content of the programmable counter 18 reaches the upper limit value Nmax of the FM band, the T flip-flop 54 is inverted again by the coincidence signal from the digital comparator 20 and the ternary counter 55 is further counted up by one to provide (1,0). The content of the higher-order bit of the ternary counter 55 is applied via the inverter 60 to the AND circuit 56 and directly to the AND circuit 58, so that when the count content of the ternary counter 55 becomes (1,0), that is, when the band being received is changed over twice, the AND circuit 56 is closed and the flip-flop 50 is reset by the output of the AND circuit 58. Thus, the auto-preset operation is stopped.

It is detected by the n-value detector 53 whether the count value of the n-step counter 51 exceeds the number of stations n that can be selected by the preset channel selecting operation and, if so, the auto-preset operation is stopped by the output of the n-value detector 53 even before sweeping of all frequencies. The n-step counter 51 is cleared by the reset output $\bar{Q}$ of the flip-flop 50.

In the foregoing embodiment the auto-preset operation is carried out in the order of the AM band and the FM band and the sweep operation is performed from lower to higher frequencies, but it is a matter of course that the sweep operation may also be carried out in the reverse direction. Moreover, although in the foregoing embodiment the present invention has been described as being applied to the electronic tuner of the PLL synthesizer system, the invention is applicable to an electronic tuner of what is called a voltage synthesizer system as well. In this case, the bias voltage that is applied to the varicap diodes is used as the frequency designating information and it is digitized for storage in the preset memory.

As will be appreciated from the foregoing description, according to the present invention, a broadcasting station having a received electric field intensity higher than a certain level can be preset only by turning ON an auto-preset key by virtue of the operation of the auto-preset circuit. Accordingly, the present invention, when applied, for instance, to a dashboard radio, permits marked simplification of the complex preset operation that has been needed in the past, and hence it is of great utility in practical use.

It will be apparent that many modifications and variations may be effected without departing from the scope of the novel concepts of the present invention.

What is claimed is:

1. A radio receiver electronic tuning system having channel selection keys and a preset memory for storing frequency designating information, for receiving broadcasting waves, comprising:

frequency sweep means for changing the broadcasting wave frequency to be received by sequentially changing frequency designating information;

broadcasting wave searching means, operatively connected to said frequency sweep means, for generating a search stop signal when a broadcasting wave having a received electric field intensity higher than a predetermined level is received during the frequency sweep;

preset channel selecting means, operatively connected to the channel selection keys and the preset memory, for reading out the frequency designating information stored in an area of the preset memory corresponding to one of the channel selection keys when said one of the channel selection keys is actuated, so as to select the broadcast wave frequency to be received;

an auto-preset key which is actuated when an automatic presetting operation is to be performed;

frequency changing means, operatively connected to said auto-preset key and said frequency sweep means, for starting said frequency sweep means, upon the actuation of said auto-preset key, to change the broadcast wave frequency to be received in a sequential order during the automatic presetting operation; and preset means, operatively connected to the preset memory, said frequency sweep means and said broadcasting wave searching means, for storing, in the preset memory, the frequency designating information being output by said frequency sweep means each time the search stop signal is received during the sequential change of the received frequency by said frequency sweep means.

2. A radio receiver according to claim 1, wherein said broadcasting waves are within two receiving bands each of which has a lower limit frequency and an upper limit frequency, wherein said frequency changing means activates said frequency sweep means so as to change the frequency to be received in sequence from the lower limit frequency to the upper limit frequency or from the upper limit frequency to the lower limit frequency, first in one receiving band and then in the other receiving band.

3. A radio receiver according to claim 2, wherein said preset means includes address generating means, operatively connected to the preset memory, for generating an address output the content of which differs each time the search stop signal is received by said preset means, and wherein the frequency designating information is written in the address location of the preset memory designated by said address output.

4. A radio receiver for receiving broadcast waves from channels having different frequencies and in different frequency bands, having a preset memory for storing frequency designating information for respective ones of the channels, comprising:
   first means for generating an automatic channel selection signal;
   second means, operatively connected to said first means, for sequentially generating frequency designating information signals in response to said automatic channel selection signal;
   third means, operatively connected to said second means, for sequentially changing the broadcast wave frequency received by said radio receiver in accordance with the sequentially generated frequency designating information;
   fourth means, operatively connected to said third means, for generating a search stop signal when the received broadcast wave has an electric field intensity which is greater than a predetermined electric field intensity;
   fifth means, operatively connected to said fourth means and to the preset memory, for storing, in the preset memory, the frequency designating information being output by said second means each time the search stop signal is generated;
   sixth means for storing first limit frequency designating information and second limit frequency designating information for each of the frequency bands received by said radio receiver, said third means sweeping from the first limit frequency to the second limit frequency sequentially in each of the receiving bands; and
   seventh means, operatively connected to said sixth means and said second means, for determining whether the sequentially generated frequency designating information is between the first and second limit frequency designating information.

5. A radio receiver according to claim 4, wherein said seventh means comprises means for outputting a coincidence signal when it is detected that the sequentially generated frequency designating information corresponds to one of the first and second limit frequency designating information for a frequency band, and wherein said fifth means includes means for outputting received frequency band switching data when the coincidence signal is output.

6. A radio receiver according to claim 4, wherein said fifth means includes address generating means, operatively connected to the preset memory, for generating a different address output each time the search stop signal is received by said fifth means, and wherein the frequency designating information is written in the location of the preset memory designated by the address output.

7. A radio receiver according to claim 6, wherein said first means comprises:
   an auto-preset key; and
   means, operatively connected to said auto-preset key, for generating the automatic channel selection signal when said auto-preset key is actuated.

8. An automatic channel setting circuit for a radio receiver which receives a plurality of signal frequencies, in different frequency bands, corresponding to different channels, comprising:
   first means for generating an automatic channel selection signal;
   second means, operatively connected to said first means, for receiving said automatic channel selection signal and for sequentially generating a frequency identification signal, including frequency identification data, corresponding to different signal frequencies to be received by the radio receiver;
   third means, operatively connected to said second means, for changing the signal frequency received by said radio receiver in dependence upon the frequency identification signal;
   fourth means, operatively connected to said third means, for generating a search stop signal each time the received signal frequency has an electric field intensity higher than a predetermined level;
   fifth means, operatively connected to said fourth means, for generating a memory write signal each time the search stop signal is generated;
   sixth means, operatively connected to said fifth means and said second means, for storing the frequency identification data output by said second means each time the memory write signal is generated, so as to store the identification of signal frequencies having an electric field intensity higher than a predetermines level;
   seventh means for storing first limit frequency identification data and second limit frequency identification data for each of the frequency bands received by the radio receiver, said third means sweeping from the first limit frequency to the second limit frequency sequentially in each of the receiving bands;
   eighth means, operatively connected to said seventh means, said second means and said fifth means, for determining whether the sequentially generated frequency identification data is between the first and second frequency identification data, said eighth means including means for outputting a coincidence signal when it is detected that sequentially generated frequency identification data corresponds to one of the first and second limit frequency identification data for a frequency band, said fifth means including means for outputting received frequency band switching data when the coincidence signal is output.

* * * * *

UNITED STATES PATENT AND TRADEMARK OFFICE
CERTIFICATE OF CORRECTION

PATENT NO. : 4,491,975
DATED : JANUARY 1, 1985
INVENTOR(S) : TATSUO ITO

It is certified that error appears in the above-identified patent and that said Letters Patent is hereby corrected as shown below:

Col. 1, line 61, "thereof to" should be --thereof,--; and "permit" should be --permitting--.

Col. 2, line 23, "circit" should be --circuit--.

Col. 5, line 49, "abovementioned" should be --above-mentioned--.

Col. 6, line 44, "abovementioned" should be --above-mentioned--.

Col. 10, line 47, "predetermines" should be --predetermined--.

Signed and Sealed this

Fourteenth Day of May 1985

[SEAL]

Attest:

DONALD J. QUIGG

Attesting Officer   Acting Commissioner of Patents and Trademarks